United States Patent [19]
Choi

[11] Patent Number: 6,057,582
[45] Date of Patent: May 2, 2000

[54] SEMICONDUCTOR DEVICE WITH GATE ELECTRODE HAVING END PORTIONS TO REDUCE HOT CARRIER EFFECTS

[75] Inventor: Ki Soo Choi, Kyungki-do, Rep. of Korea

[73] Assignee: LG Semicon Co., Ltd., Chungcheongbuk-Do, Rep. of Korea

[21] Appl. No.: 09/164,631

[22] Filed: Oct. 1, 1998

[30] Foreign Application Priority Data

Feb. 4, 1998 [KR] Rep. of Korea .......................... 98-3066

[51] Int. Cl.⁷ .......................... H01L 29/76; H01L 29/94; H01L 31/62
[52] U.S. Cl. .......................... 257/408; 257/411; 257/412; 257/325; 257/333; 257/395; 257/388
[58] Field of Search .................... 257/408, 412, 257/325, 388, 411, 395, 333, 327, 336, 344

[56] References Cited

U.S. PATENT DOCUMENTS

| | | | |
|---|---|---|---|
| 5,144,393 | 9/1992 | Yamaguchi et al. | 357/23.9 |
| 5,182,619 | 1/1993 | Pfiester | 257/382 |
| 5,330,920 | 7/1994 | Soleimani et al. | 437/24 |
| 5,422,505 | 6/1995 | Shirai | 257/327 |
| 5,512,771 | 4/1996 | Hiroki et al. | 257/369 |
| 5,610,430 | 3/1997 | Yamashita et al. | 257/412 |

*Primary Examiner*—Mahshid Saadat
*Assistant Examiner*—Matthew Warren
*Attorney, Agent, or Firm*—Morgan, Lewis & Bockius LLP

[57] ABSTRACT

Semiconductor device and method for fabricating the same, is disclosed, in which a gate insulating film is formed thicker at portions opposite to edge portions of a gate electrode for preventing the hot carrier possible to occur due to a strong electric field of the gate electrode, that can improve a device reliability, the device including a semiconductor substrate, a gate insulating film formed on the semiconductor substrate, the gate insulating film having both end portions formed thicker than a center portion, a gate electrode formed on the gate insulating film, the gate electrode having a center portion formed thicker than portions thereof on both sides of the gate insulating film, and impurity regions formed in surfaces of the semiconductor substrate on both sides of the gate electrode, and the method including the steps of (1) forming a gate insulating film on a semiconductor substrate, and forming a gate electrode having a thicker center portion on the gate insulating film, (2) expanding thicknesses of the gate insulating film at both ends thereof, and (3) forming impurity regions in surfaces of the semiconductor substrate on both sides of the gate electrode.

7 Claims, 7 Drawing Sheets

SEMICONDUCTOR DEVICE WITH GATE ELECTRODE HAVING END PORTIONS TO REDUCE HOT CARRIER EFFECTS

BACKGROUND OF THE INVENTION

1. Field of the Invention

The present invention relates to a semiconductor device, and more particularly, to a semiconductor device and a method for fabricating the same, in which thicknesses of a gate insulating film at edge portions of a gate electrode are formed thicker for improving electric characteristics of the device.

2. Background of the Related Art

Ceaseless researches for reducing sizes of transistors in semiconductor integrated circuits are underway for obtaining semiconductor integrated circuits that have excellent performances but highly integrated. As results of these efforts, semiconductors are scaled down to a submicron level. The reduction of a semiconductor device size should be in a horizontal dimension as well as in a vertical dimension proportional to the reduction of the horizontal dimension, for balancing various device characteristics. That is, if a size of device is reduced, for example, if a distance between a source and a drain of a transistor comes closer, undesired device characteristic changes are occurred, of which typical one is the short channel effect. For solving the short channel effect, a horizontal dimension(a gate length) as well as a vertical dimension(a thickness, a junction depth and so on of a gate insulating film) should be reduced, with subsequent lowering of applied voltage, increase of doping concentration and, particularly, adjustment of a doping profile of a channel region. However, since the semiconductor device should satisfy an operating power requirement for a particular electronic appliance to which the device is applied, the semiconductor device, particularly, NMOS transistor becomes to have a structure vulnerable to hot carrier occurred by a sudden acceleration of electrons applied from a source in a strong electric field near a drain due to the short channel effect caused by a reduced distance between the source and the drain, because the operating power requirement of the electronic appliance to which semiconductor device is applied has not yet been reduced though the semiconductor size has been reduced. This hot carrier is caused by a short channel and a very strong electric field coming from a high applied voltage in an approximation of a drain junction.

A background method for fabricating a semiconductor device will be explained referring to the attached drawings. FIGS. 1A~1D illustrate sections for explaining the steps of the background art method for fabricating a semiconductor device.

Referring to FIG. 1A, a gate insulating film 12 is formed on an active region of a semiconductor substrate 11 having field oxide films(not shown) formed selectively thereon. A gate electrode polysilicon layer 13 and a cap insulating film 14 are formed in succession on the gate insulating film 12. Then, as shown in FIG. 1B, a photoresist film(not shown) is coated on the cap insulating film 14 and subjected to patterning by exposure and development, which is then used in a successive etching of the cap insulating film 14 and the polysilicon layer 13 to a gate electrode 13a. As shown in FIG. 1C, impurity ions are injected into surfaces of the substrate 11 on both sides of the gate electrodes 13a using the gate electrode 13a as a mask, to form LDD(Lightly Doped Drain) regions 15 therein. Then, an insulating layer is formed on an entire surface of the semiconductor substrate 11 including the gate electrode 13a and etched back, to form insulating sidewalls 16 at both sides of the gate electrode 13a as shown in FIG. 1D. Thereafter, impurity ions are injected using the insulating sidewalls 16 and the gate electrode 13a as masks, to form source and drain impurity regions 17 and 17a.

However, the aforementioned method for fabricating a semiconductor device has a problem in that the reduction of a channel length as the device integration advances result in a hot carrier effect by the gate electrode near the drain, that degrades device electric characteristics.

SUMMARY OF THE INVENTION

Accordingly, the present invention is directed to a semiconductor device and a method for fabricating the same that substantially obviates one or more of the problems due to limitations and disadvantages of the related art.

An object of the present invention is to provide a semiconductor device and a method for fabricating the same, which can prevent the hot carrier effect, whereby improving device electric characteristics.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a semiconductor substrate, a gate insulating film formed on the semiconductor substrate, the gate insulating film having both end portions formed thicker than a center portion, a gate electrode formed on the gate insulating film, the gate electrode having a center portion formed thicker than portions thereof on both sides of the gate insulating film, and impurity regions formed in surfaces of the semiconductor substrate on both sides of the gate electrode.

In other aspect of the present invention, there is provided a method for fabricating a semiconductor device, including the steps of (1) forming a gate insulating film on a semiconductor substrate, and forming a gate electrode having a thicker center portion on the gate insulating film, (2) expanding thicknesses of the gate insulating film at both ends thereof, and (3) forming impurity regions in surfaces of the semiconductor substrate on both sides of the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
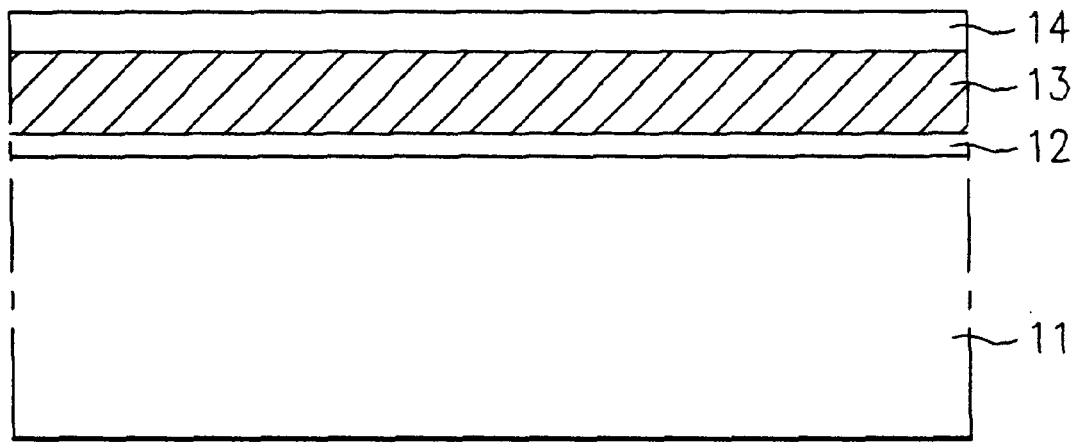
FIGS. 1A~1D illustrate sections for explaining the steps of a background art method for fabricating a semiconductor device.
Figure 1B:
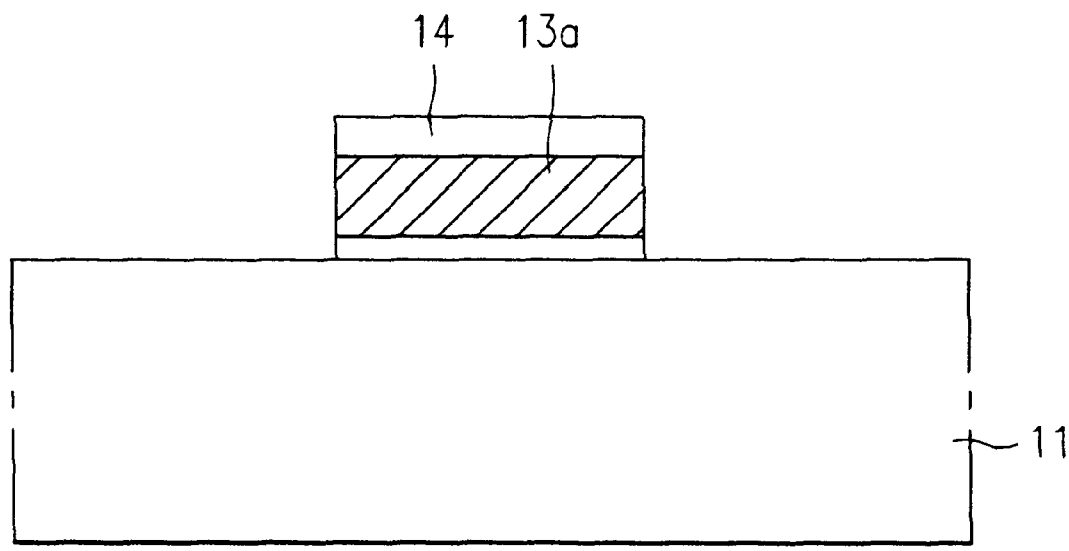
Figure 1C:
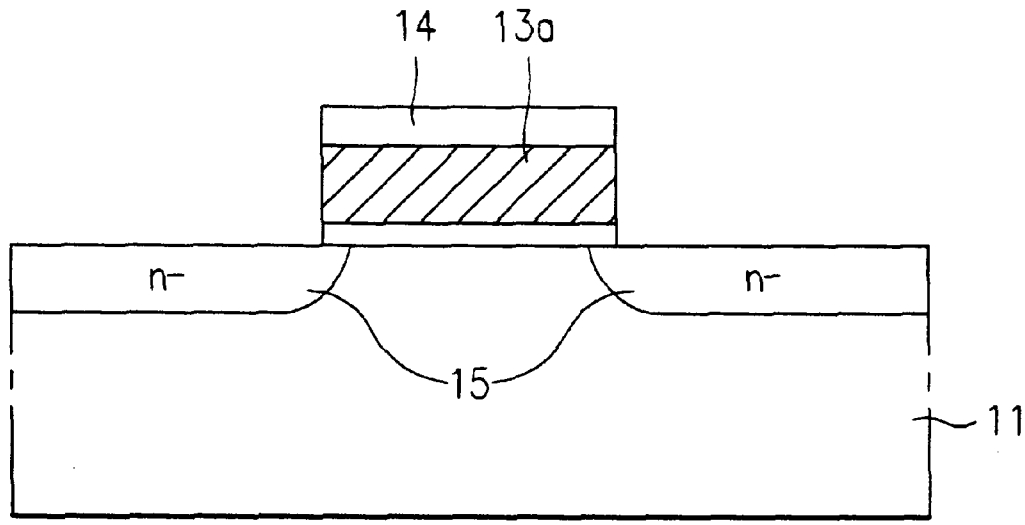
Figure 1D:
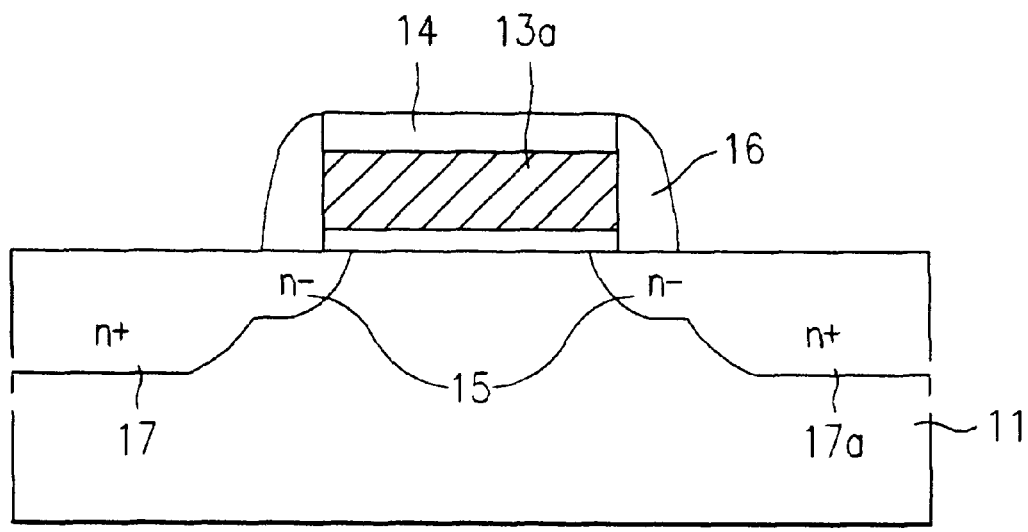
Figure 2:
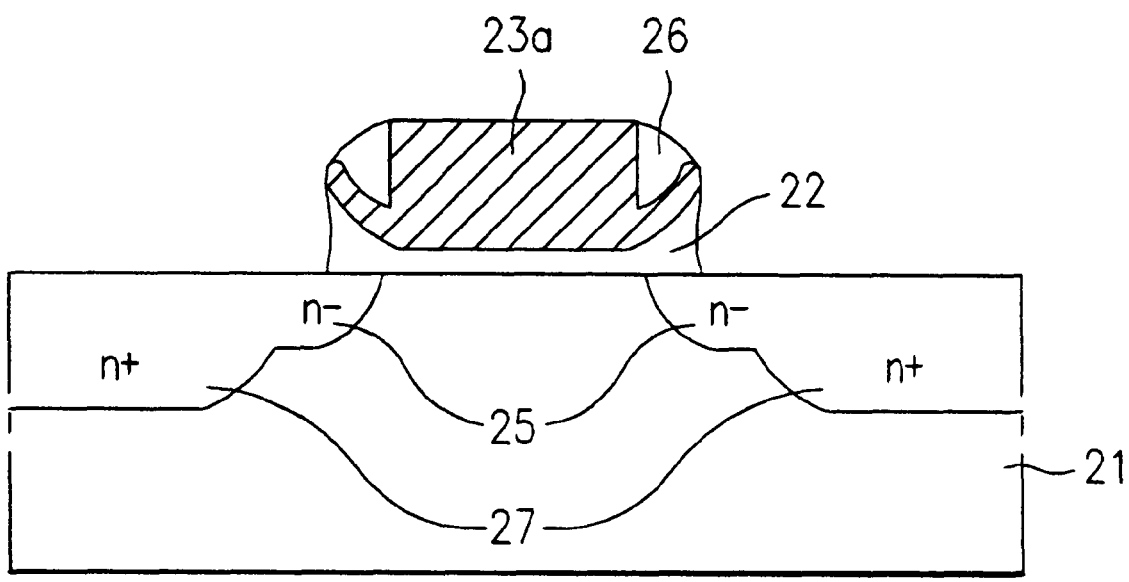
FIG. 2 illustrates a section of a semiconductor device in accordance with a preferred embodiment of the present invention.

Reference will now be made in detail to the preferred embodiments of the present invention, examples of which are illustrated in the accompanying drawings. FIG. 2 illustrates a section of a semiconductor device in accordance with a preferred embodiment of the present invention.

Referring to FIG. 2, the semiconductor device in accordance with a preferred embodiment of the present invention includes a semiconductor substrate 21, a gate insulating film 22 having thicknesses at both sides thicker than a thickness at a center formed on the semiconductor substrate 21, a gate electrode 23a having a thickness at a center thicker than thicknesses at both sides formed on the gate insulating film 22, and source/drain impurity regions 27 of including LDD structures 25 formed in surfaces of the semiconductor substrate 21 on both sides of the gate electrode 23a. In addition, insulating sidewalls 26 are formed on the two sides of the gate electrode 23a.

A method for fabricating the aforementioned semiconductor device will be explained. FIGS. 3A–3D illustrate sections for explaining the steps of a method for fabricating a semiconductor device in accordance with a first embodiment of the present invention.

Figure 3A:
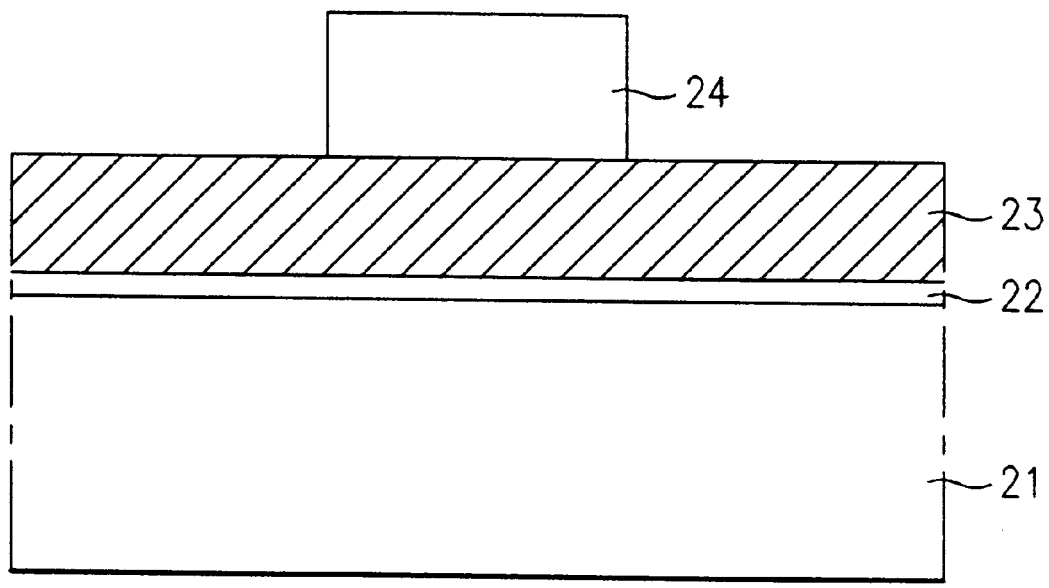
FIGS. 3A–3D illustrate sections for explaining the steps of a method for fabricating a semiconductor device in accordance with a first embodiment of the present invention; and, FIGS. 4A–4D illustrate sections for explaining the steps of a method for fabricating a semiconductor device in accordance with a second embodiment of the present invention.
Figure 3B:
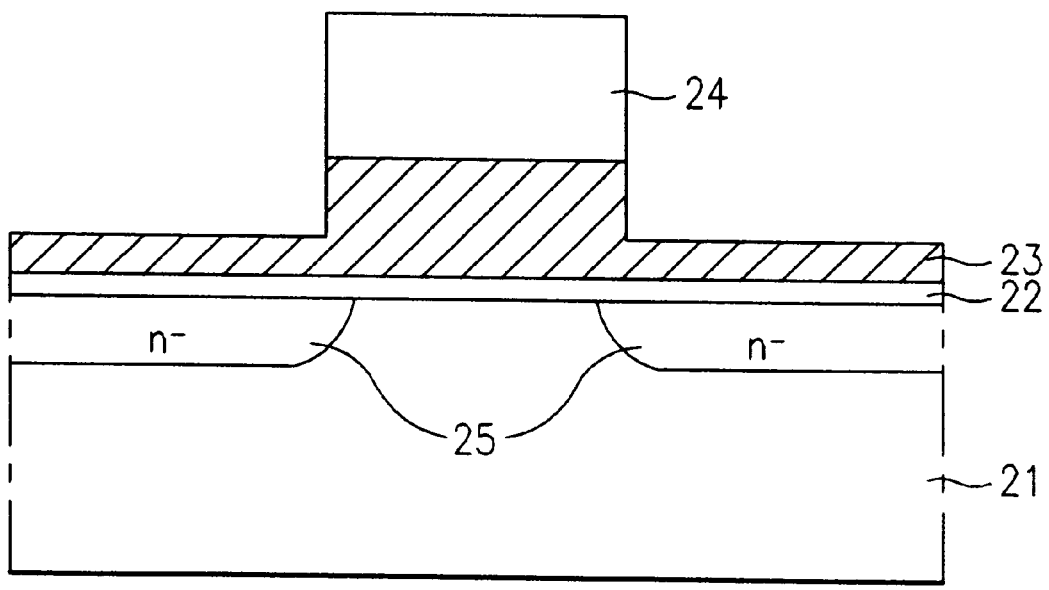
Figure 3C:
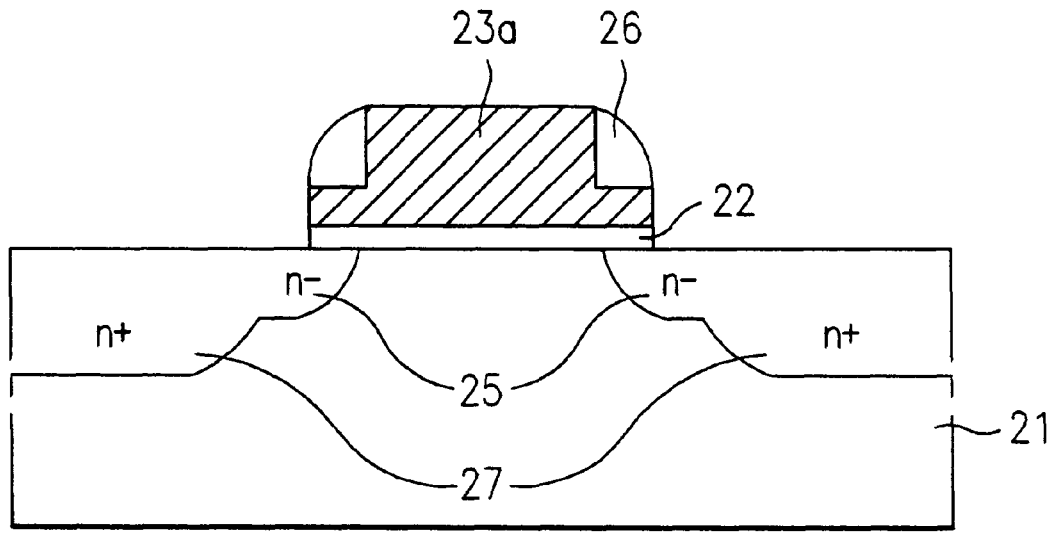
Figure 3D:
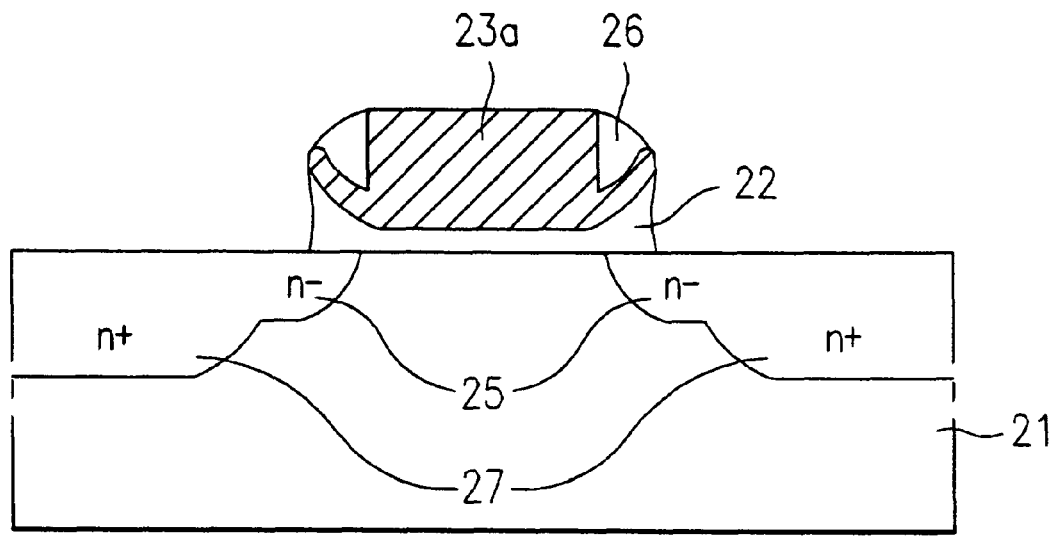

Referring to FIG. 3A, a gate insulating film 22 is formed on a semiconductor substrate 21, and a gate electrode polysilicon layer 23 is formed on the gate insulating film 22. A photoresist film 24 is coated on the polysilicon layer 23 and subjected to patterning by exposure and development to define a gate electrode region. Then, as shown in FIG. 3B, the polysilicon layer 23 is etched to a depth using the patterned photoresist film 24 as a mask, leaving a portion of the polysilicon layer 23 under the photoresist film 24 intact. Entire surface of the polysilicon layer 23 is injected of $n^-$ impurity ions without using a mask, to form LDD regions 25 in surfaces of the semiconductor substrate 21 opposite to the polysilicon layer 23 having etched to the depth. And, as shown in FIG. 3C, after removal of the photoresist film 24, an insulating film is deposited on an entire surface of the semiconductor substrate 21 inclusive of the polysilicon layer 23 and etched back, to form insulating sidewalls 26. The remained polysilicon layer 23 and the gate insulating film 22 are etched until the surface of the semiconductor substrate 21 is exposed using the insulating sidewalls 26 as masks, to form a gate electrode 23a. Then, as shown in FIG. 3D, an entire surface inclusive of the insulating sidewalls 26 and the gate electrode 23a is heavily doped with $n^+$ impurities, to form source and drain impurity regions 27 in surfaces of the semiconductor substrate 21 on both sides of the gate electrode 23a. Then, upon conduction of an oxidation process, the polysilicon layer in an edge portion of the gate electrode 23a is bent upward, forming the gate insulating film 22 also to have a thickness at a portion opposite to the edge portion of the gate electrode 23a thicker than a thickness at a center portion of the gate electrode. The thicker gate insulating film 22 at a portion opposite to the edge portion of the gate electrode 23a prevents the hot carrier from occurring due to the strong electric field near the drain impurity region 27.

FIGS. 4A–4D illustrate sections for explaining the steps of a method for fabricating a semiconductor device in accordance with a second embodiment of the present invention.

Figure 4A:
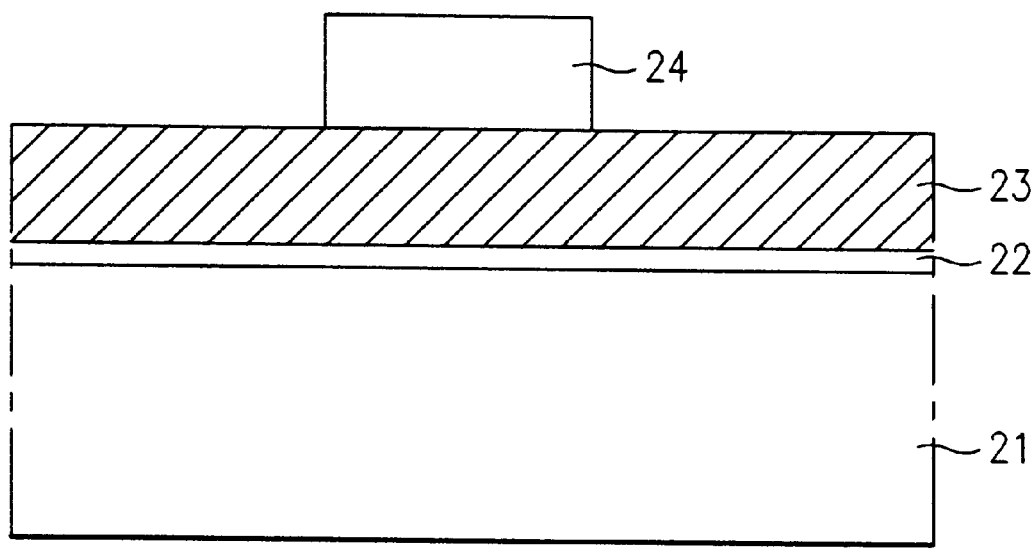
Figure 4B:
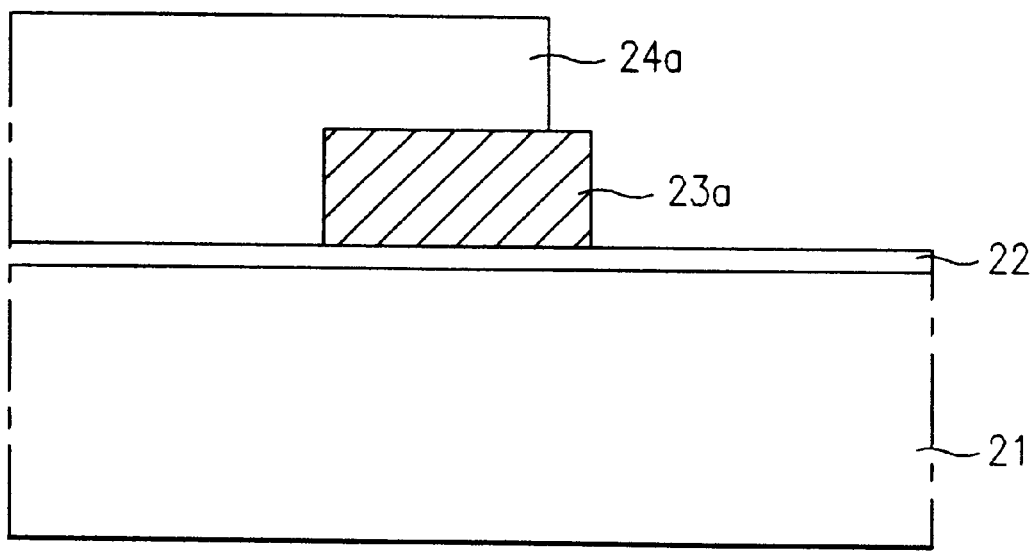
Figure 4C:
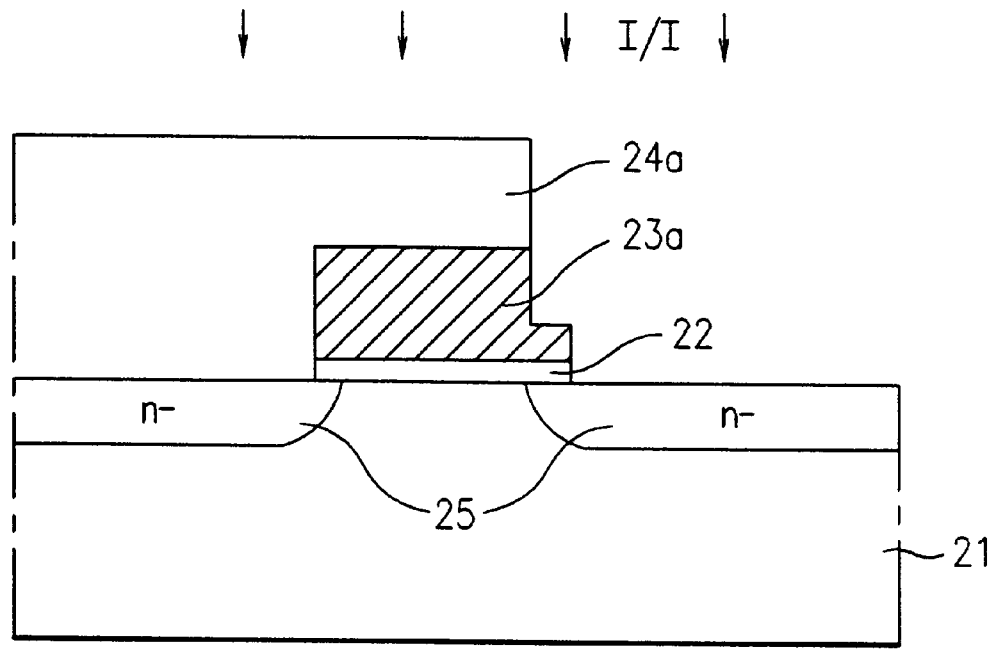
Figure 4D:
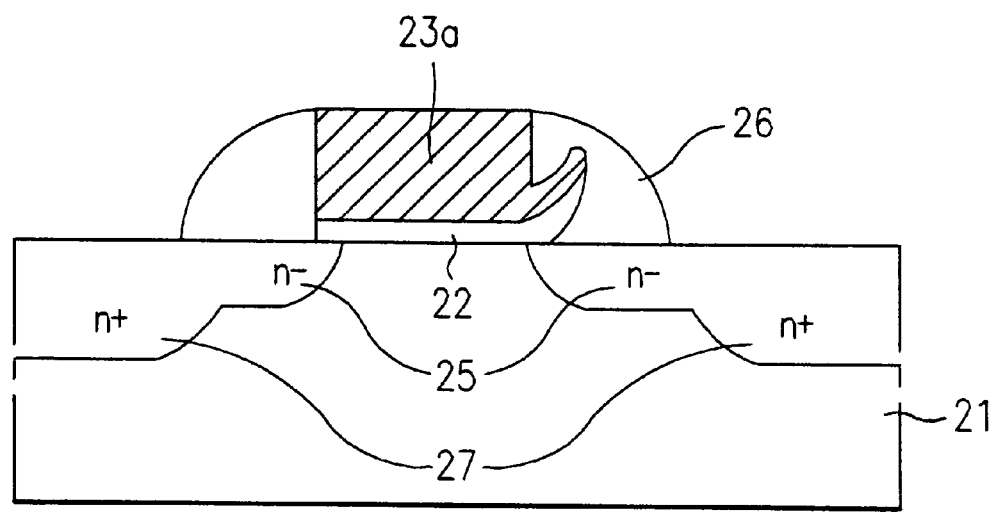

Referring to FIG. 4A, a gate insulating film 22 is formed on a semiconductor substrate 21, and a gate electrode polysilicon layer 23 is formed on the gate insulating film 22. A photoresist film 24 is coated on the polysilicon layer 23 and subjected to patterning to define a gate electrode region. As shown in FIG. 4B, the polysilicon layer 23 is selectively etched using the patterned photoresist film 24 as a mask to form a gate electrode 23a. The photoresist film 24 is removed, and a photoresist film 24a is coated again on an entire surface of the substrate 21 inclusive of the gate electrode 23a and subjected to patterning by exposure and development, such that only one edge of the gate electrode 23a is exposed. As shown in FIG. 4C, the exposed edge portion of the gate electrode 23a is etched to a depth using the photoresist film 24a as a mask. And, $n^-$ impurities are injected using the gate electrode 23a as a mask, to form LDD regions 25 in surfaces of the semiconductor substrate 21 on both sides of the gate electrode 23a. Then, as shown in FIG. 4D, after removing the photoresist film 24a, an oxidation process is conducted to bend the edge portion of the gate electrode 23a having an etched portion upward. This is possible because the oxidation is more active at the edge portion of the gate insulating film 22 in the oxidation process due to the thin gate electrode 23a at the edge portion, to form the gate insulating film 22 to have a thickness at a portion opposite to the edge portion of the gate electrode 23a having an etched portion formed thicker than other regions. After completion of the oxidation process, an insulating film is formed on an entire surface of the semiconductor substrate 21 inclusive of the gate electrode 23a and etched back, to form insulating sidewalls 26 at both sides of the gate electrode 23a. Thereafter, upon making a heavy injection of $n^+$ impurities using the gate electrode 23a and the insulating sidewalls 26 as masks, source and drain impurity regions 27 are formed in surfaces of the semiconductor substrate 21 on both sides of the gate electrodes 23a.

As has been explained, since the thicker gate insulating film formed at portions opposite to edge portions of a gate electrode prevents the hot carrier from occurring in an approximation of drain due to a strong electric field from the gate electrode, the semiconductor device and the method for fabricating the same can improve a device reliability.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
    a semiconductor substrate;
    a gate insulating film formed on the semiconductor substrate, the gate insulating film having two end portions formed thicker than a center portion;
    a gate electrode formed on the gate insulating film, the gate electrode having a center portion formed thicker than two end portions thereof, wherein each of the two end portions of the gate electrode has a top surface and a bottom surface, both the top surface and the bottom surface being slanted down and arched toward the center portion of the gate electrode;

insulating sidewalls formed above the top surfaces of the two end portions of the gate electrode; and impurity regions formed in surfaces of the semiconductor substrate on both sides of the gate electrode.

2. The semiconductor device as claimed in claim 1, wherein the gate electrode is formed of polysilicon.

3. The semiconductor device as claimed in claim 1, wherein the impurity regions include LDD regions formed in portions of the semiconductor substrate adjacent to the two end portions of the gate insulating film, and heavily doped impurity regions formed in portions of the semiconductor substrate adjacent to the LDD regions.

4. A semiconductor device, comprising:

a semiconductor substrate;

a gate insulating film formed on the semiconductor substrate having a first portion with a first thickness and a second portion with a second thickness, the second thickness being greater than the first thickness;

a gate electrode having a first section on the first portion of the gate insulating film and a second section on the second portion of the gate insulating film, the first section of the gate electrode being thicker than the second section of the gate electrode, wherein the second section of the gate electrode has a top surface and a bottom surface, both the top surface and the bottom surface being slanted down and arched toward the first section of the gate electrode;

an insulating spacer formed above the top surface of the second section of the gate electrode; and impurity regions formed in surfaces of the semiconductor substrate on both sides of the gate electrode.

5. The semiconductor device as claimed in claim 4, wherein the gate electrode is formed of polysilicon.

6. The semiconductor device as claimed in claim 4, wherein the impurity regions include LDD regions formed in portions of the semiconductor substrate adjacent to the gate electrode, and heavily doped impurity regions formed in portions of the substrate adjacent to the LDD regions.

7. The semiconductor device as claimed in claim 1, wherein the insulating sidewalls are formed only above the two end portions of the gate electrode and not on the center portion of the gate electrode.

* * * * *